United States Patent [19]
Dickerson

[11] 3,964,020
[45] June 15, 1976

[54] HIGH VOLTAGE SYSTEM WITH SELF-TEST CIRCUITRY

[75] Inventor: Arthur F. Dickerson, Woodland Hills, Calif.

[73] Assignee: Hughes Aircraft Company, Culver City, Calif.

[22] Filed: Mar. 6, 1975

[21] Appl. No.: 556,074

[52] U.S. Cl. .................. 340/146./AG; 235/151.21; 250/199; 317/9 R; 317/DIG. 1; 324/96; 340/189 R; 340/256
[51] Int. Cl.² .............. G08C 25/00; G08C 23/00; H04B 9/00; H04B 17/00
[58] Field of Search .................. 178/69.5 R; 235/151.21; 250/199; 307/208, 216, 242; 317/9 R, DIG. 1; 324/96; 340/146.1 AG, 189 R, 190, 222, 248 R, 243 R, 256, 419

[56] References Cited
UNITED STATES PATENTS

| | | |
|---|---|---|
| 3,275,892 | 9/1966 | Schweitzer .................. 317/9 R |
| 3,461,384 | 8/1969 | Bayati et al. .................. 324/96 |
| 3,492,574 | 1/1970 | Heintz et al. .................. 324/96 |
| 3,597,684 | 8/1971 | Damen .................. 324/96 |
| 3,619,612 | 11/1971 | Belke et al. .................. 340/189 R X |
| 3,666,956 | 5/1972 | von Willisen .................. 250/199 |
| 3,793,636 | 2/1974 | Clark et al. .................. 340/189 R X |
| 3,828,130 | 8/1974 | Yamaguchi .................. 178/69.5 R |

*Primary Examiner*—R. Stephen Dildine, Jr.
*Attorney, Agent, or Firm*—Fay I. Konzem; W. H. MacAllister

[57] ABSTRACT

A high voltage system with self-test circuitry which senses the amount of current in a high voltage line and communicates this information by means of fiber optics to control electronics which in turn communicate said information to actuator means which compensate for excessive amounts of current or notify the operator of a fault. Also the system provides a continuous and automatic self test of the communication lines by use of a clocked parity checking system.

6 Claims, 3 Drawing Figures

U.S. Patent    June 15, 1976    3,964,020
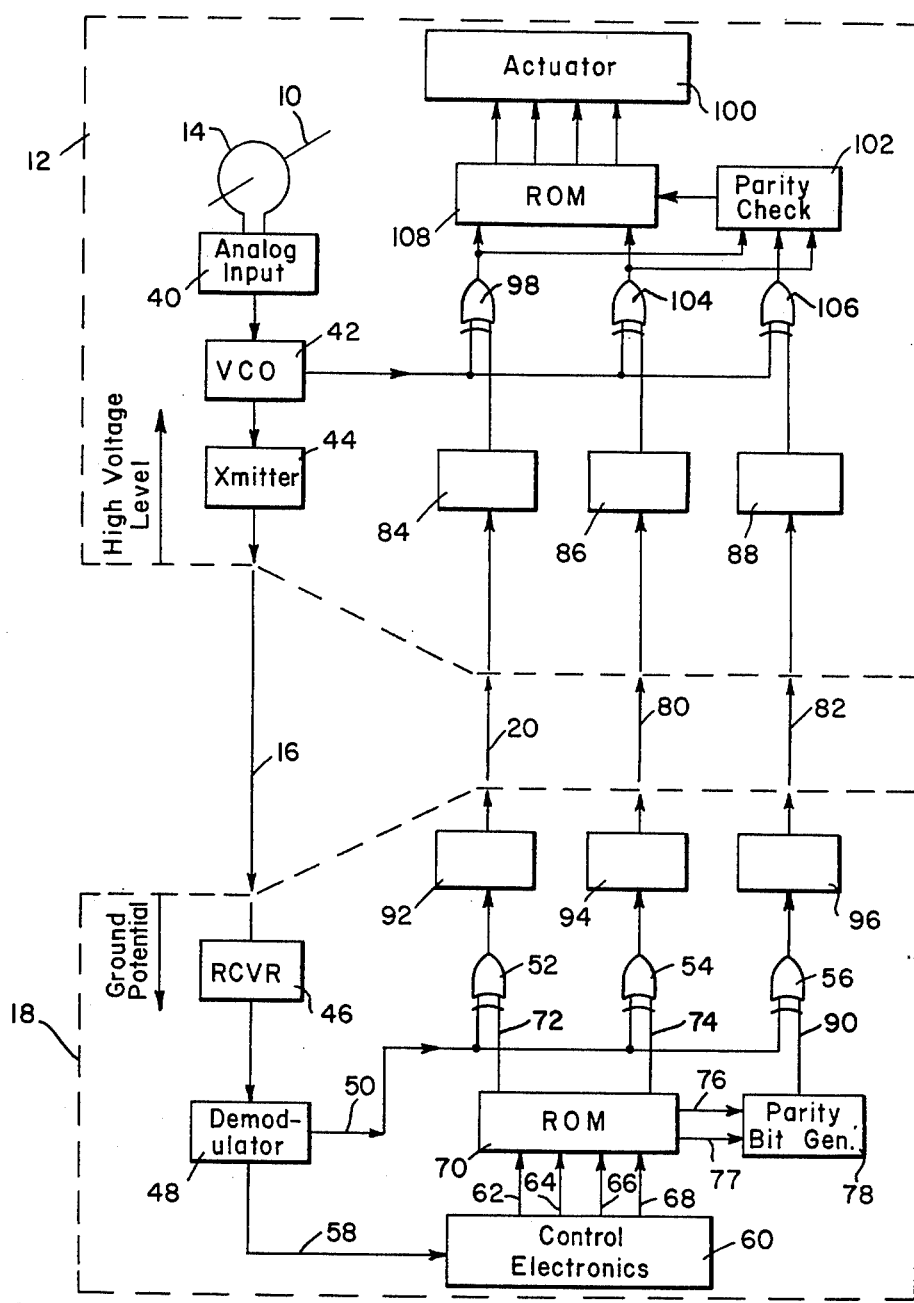
Fig. 2.
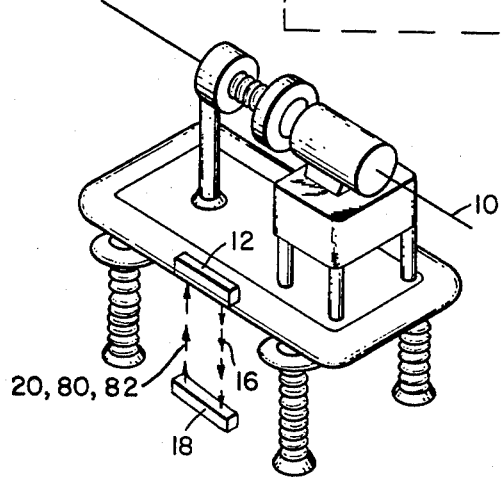
Fig. 1.
Fig. 3.
| DB | CK | Y |
|---|---|---|
| 0 | 0 | 0 |
| 0 | 1 | 1 |
| 1 | 0 | 1 |
| 1 | 1 | 0 |

HIGH VOLTAGE SYSTEM WITH SELF-TEST CIRCUITRY

BACKGROUND OF THE INVENTION

1. Field of the Invention

This invention relates to a high voltage sensing and control system, and more particularly to a high voltage system which provides a continuous self-test to detect errors in the communication of information within said system.

2. Description of the Prior Art

In the art, in high voltage systems it is often necessary to operate separate pieces of electronic equipment at both ground potential and the line potential. There exists a problem in communicating information between the different pieces of equipment across the high voltage gradient between them.

Self-test circuitry must also be provided in such a high voltage system, which takes into account that the data may change at a slow rate and may be subject to electromagnetic interference.

SUMMARY OF THE INVENTION

The high voltage and self-test system, in accordance with the invention, consists of current sensing means which detect the amount of current flowing through a high voltage line and transmit this information over a data link to control electronics which encodes the digital control commands from the control electronics and then transmits these commands via a plurality of communication links, then to be decoded and then delivered to actuator means which compensates for faults in the high voltage system or notifies the operator of such.

Also in this high voltage system is a continuous self-test which monitors the transmission of information over the various communication links and sends out a fault signal if there exists a malfunction. Such a self-test system consists of a clocked parity checking system in conjunction with the current sensing means described above.

Accordingly, it is an object of this invention to communicate the line current signal from line potential to a separate piece of electronic equipment at ground potential.

It is another object to communicate control commands from the ground potential control electronics to actuators at the line potential when the control electronics sends out a command signal to the actuators to activate the circuit breaker or to insert a current limiting resistor or to take whatever measure is necessary.

Another object is to provide a continuous automatic self-test of the communication equipments and paths and to detect any malfunction in said equipments and paths.

The features of the present invention which are believed to be novel are set forth with particularity in the appended claims. The present invention, both as to its organization and manner of operation, together with further objects and advantages thereof, may be understood best by reference to the following description, taken in connection with the accompanying drawings.

BRIEF DESCRIPTION OF THE DRAWINGS

FIG. 1 is a high voltage system with two separate pieces of electronic equipment which transmit information optically.

FIG. 2 is a block diagram of the circuitry of the high voltage and continuous self-test system of the present invention.

FIG. 3 is a truth table for an exclusive OR gate.

DETAILED DESCRIPTION

Referring now to FIG. 1, the high voltage (HV) system has HV transmission line 10 and electronic circuitry 12 which senses the amount of current flowing through line 10 and transmits this information via communication link 16 to control circuitry 18. The electronic circuitry 12 being at the line potential and control circuitry 18 being at ground potential. One possible method of communicating this information is by means of fiber-optic bundles, which are excellent insulators, and free of electromagnetic and electrostatic interference. Control Commands and self-test information is then communicated from control electronics 18 over communication links 20, 80 and 82 to the electronic circuitry 12.

FIG. 2 shows the HV and continuous self-test system with its communication links of the present invention. Current sensor 14 senses the amount of current being transmitted on line 10 and sends a representative analog signal to analog input 40. Analog input 40 changes the amount of current sensed by 14 into a representative voltage signal which in turn is sent to voltage controlled oscillator (VCO) 42. VCO 42 has two outputs which are electrically the same; the first, which delivers a 1 megahertz carrier clock pulse to digital logic devices 98, 104, and 106 and the second output which is a frequency modulated (fm) carrier on which the modulation is the analog signal of the line current sensor 14. Transmitter 44 consists of an electro-optical converter which converts the electrical signal from VC0 42 to an optical signal, which is transmitted via communication line 16 to receiver 46 which converts the optical signal back to an electrical signal. The electrical signal from receiver 46 is then demodulated in demodulator 48; the carrier being transmitted as a clock pulse via line 50 to digital logic device, which in this case are exclusive OR gates 52, 54, and 56. And the analog signal of the line current sensor is sent via line 58 to control electronics 60. When there is a fault in the high voltage transmission line 10 or a surge of current in line 10, current sensor 14 senses this change and delivers a representative analog signal via line 58 to control electronics 60 which in turn delivers the appropriate control signal via lines 62, 64, 66, and 68, to read only memory (ROM) 70. Said control commands are encoded in electronics 12, transmitted to electronics 18, decoded and, if verified by self-test, tell actuator or fault correction means 100 to take the appropriate action; for example, to insert a current limiting resistor or to throw a circuit breaker or to take whatever measure is necessary. ROM 70 stores the digital control command from control electronics 60 and then reads out said information via lines 72, 74, 76, and 77.

Parity bit generator 78 is used in conjunction with parity check 102 to check to see if the digital information transmitted via lines 20, 80, and 82 is correctly received by receivers 84, 86, and 88, of electronic circuitry 12 and that communication link 16 is operating. That is, that there are no breaks or faults in the transmission of the information from control circuitry 18 to electronic circuitry 12 or from 12 to 18. This clocked parity check is based on the use of an additional bit, which is generated by parity bit generator 78, into each group of digital information delivered from ROM 70 via lines 76 and 77. The parity bit associated with each of these groups of digital information is in an "even parity-bit" checking system so that the total number of 1's in the digital information group plus the parity bit is always even. For example, if the information on lines 76 and 77 were 01, then the parity bit would be a 1, in order to make the total number of 1's even. Or if the digital information on lines 76 and 77 were 00, then the parity bit would be a 0 since there is already an even number of 1's.

The 1 megahertz carrier clock is transmitted to a first input of exclusive OR gates 52, 54, and 56 via line 50. Digital information is delivered from ROM 70 and parity bit generator 78 to said exclusive OR gates via a second input 72, 74, and 90.

FIG. 3 shows the truth table for an exclusive OR gate. CK represents the carrier clock and DB represents the data bit on lines 72, 74, and 90. Y represents the output from exclusive OR gates 52, 54, and 56. The information from these exclusive OR gates is transmitted by electro-optical transmitters 92, 94, and 96, via optical communication links 20, 80, and 82, respectively, to optical-to-electrical converters or receivers 84, 86, and 88. The digital data from said receivers is then inputed into a first input into exclusive OR gates 98, 104, and 106. The second input to said gates is a 1 megahertz carrier clock from VCO 42. Said gates output appropriate digital data corresponding to the outputs of the truth table of FIG. 3. Exclusive OR gates 98 and 104 transmit output data to ROM 108. And exclusive OR gate 106 delivers digital information to parity check 102 where it is compared with the digital data of lines 98 and 104 and if parity is verified, in turn delivers that information into ROM 108.

Finally, the information from ROM 108 is delivered via a plurality of output lines to actuator or fault correction means 100 which controls whatever function is needed, for example, if current sensor 14 senses an excess of current in the transmission line 10 then actuator 100 will insert a current limiting resistor or if the excessive current is too high, actuator 100 will throw a circuit breaker and shut down the line.

OPERATION OF THE CIRCUIT

In normal operation, the control commands will input binary low information via lines 62 - 68 to ROM 70. The output of ROM 70 via lines 72 and 74 will be at a low binary level. With one input to the exclusive OR gates low, the output from said gates will follow the carrier clock pulse which is on the other input to said gates. The output of exclusive OR gates 54 and 54 will then be inputed into exclusive OR gates 98 and 104, this high-low, high-low, etc. input will be in phase with the 1 megahertz carrier clock from VOC 42 which is being inputed into the other input to exclusive OR gates 98 and 104. Therefore, the output from exclusive OR gates 98 and 104 will be at a low level, thereby tracking the binary low information being inputed via lines 72 and 74 from ROM 70.

But if, for example, the current sensor 14 senses a surge in current which requires the actuator 100 to insert a current limiting resistor, the analog signal via line 58 would tell the control electronics 60 to output, for example, a 01 code via ROM 70 to exclusive OR gates 52 and 54. As discussed previously, the output from exclusive OR gaate 98 would track the binary low information inputed via line 72 from ROM 70.

Whereas, the high level information via line 74 to exclusive OR gate 54 in conjunction with the carrier clock on the other input to exclusive OR gate 54 would output digital information which would be the inverse of the carrier clock from VC0 42. This information would be transmitted via optical communication link 80 through receiver 86 to one of the inputs to exclusive OR gate 104. Since this information would be the inverse of the carrier clock from VC0 42 the output of exclusive OR gate 104 would always be high, thereby tracking binary high information from ROM 70 via line 74. This 01 code would be sent through ROM 108 and if verified by parity check 102 is sent to actuator 100 which would have programmed the response that when it receives a 01 code to insert a current limiting resistor into the high voltage line 10, for example.

If one of the optical communication paths 16, 20 80, or 82 is broken or there is a malfunction in either electronic circuitry 12 or control circuitry 18, this fault will be detected by the clocked parity check apparatus. If for example the digital information is 110 on lines 20, 80, and 82, respectively, and link 20 was broken thereby delivering a 0 or low binary information to exclusive OR gate 98, then the ROM 108 and parity check 102 would detect an error since even parity no longer existed, that is, the ROM would be receiving an alternating high-low-high-low binary level signal from exclusive OR gate 98 and a high binary level from exclusive OR 104 and a low data bit from parity check 102; ROM 108 would thereby be receiving an alternating data bit code 010-110-010, etc. since this is an even parity-bit checking system, the total number of 1's received by ROM 108 is alternating even-odd-even-odd, etc. and parity check 102 and ROM 108 would detect an error in the system. This error would be transmitted to actuator 100 which would alert the operator of the fault.

Although the device which has just been described appears to afford the greatest advantages for implementing the invention, it will be understood that various modifications may be made thereto without going beyond the scope of the invention, it being possible to replace certain elements by other elements capable of fulfilling the same technical functions therein.

What is claimed is:

1. A high voltage system which automatically and continuously self-tests its communication links to check for malfunctions, comprising:
    sensing means for sensing the value of electrical conditions in a high voltage line;
    control electronics;
    a communication link;
    signal processing means for generating a voltage signal representing the value sensed by said sensing means, said signal being sent along said communication link to said control electronics and also as a digital clock;
    fault correction means for compensating for faults in said system;
    a plurality of communications paths;
    said control electronics for delivering control commands to said fault correction means via said plurality of communication paths having a first and second end;
    clocked encoding means at said first end of said communication paths and clocked decoding means at said second end of said communication paths;

parity bit generator connected between said control electronics and one of said encoding means for producing an appropriate parity bit;

parity checking means connected between one of said decoding means and said fault correction means for comparing that the digital information going into said encoding means is the same information being outputed from said decoding means.

2. The high voltage system of claim 1, wherein said encoding and decoding means are exclusive OR gates.

3. The high voltage system of claim 1, wherein said communication paths are optically produced by means of fiber-optics.

4. A high voltage system which automatically self-tests its communication paths to check for malfunctions, comprising:

current sensing means for sensing the amount of current flowing through a high voltage line and outputing an analog signal;

signal processing means for generating a voltage signal representative of the amount of current and for generating a frequency modulated carrier and digital clock;

a communication link;

receiving means;

transmitting means for sending the frequency modulated carrier on which the modulation is said analog signal from said signal processing means over said communication link to said receiving means;

first and second set of digital logic devices, each having a plurality of inputs and an output;

first and second storage means having a plurality of inputs and outputs;

parity bit generator;

control circuitry;

demodulator for separating said carrier clock and said analog signal, said analog signal being delivered to said control circuitry and said carrier clock being delivered to said first input of said first set of logic devices;

said outputs of said first storage devices being connected to said second input to said first set of digital devices and to said parity bit generator;

a plurality of communication paths;

the outputs of said first set of digital logic devices being transmitted over said communication paths to said first input to said second set of digital logic devices;

said carrier clock being received on said second input of said second set of digital logic devices;

parity checking means connected between one of said second set of digital logic devices and said second storage means for checking that the digital information outputed by said second set of digital devices is the same information as that outputed by said first storage means;

fault correction means for compensating for faults in said communication paths;

said outputs from said second storage means being connected to said correction means.

5. A high voltage system as recited in claim 4, wherein said digital logic devices are exclusive OR gates.

6. A high voltage system as recited in claim 4, wherein said communication paths are optically produced by means of fiber-optics.

* * * * *

UNITED STATES PATENT OFFICE
CERTIFICATE OF CORRECTION

Patent No. 3,964,020                Dated    June 15, 1976

Inventor(s) Arthur F. Dickerson

It is certified that error appears in the above-identified patent and that said Letters Patent are hereby corrected as shown below:

Column 3, line 52, "The output of exclusive OR gates 54 and 54" should read--The output of exclusive OR gates 52 and 54--.

Column 3, line 55, "1 megahertz carrier clock from VOC 42 which is being" should read--1 megahertz carrier clock from VCO 42 which is being--.

Column 3, line 67, "OR gaate 98" should read--OR gate 98--.

Signed and Sealed this

Fourteenth Day of September 1976

[SEAL]

Attest:

RUTH C. MASON
*Attesting Officer*

C. MARSHALL DANN
*Commissioner of Patents and Trademarks*